United States Patent
Annunziata et al.

(10) Patent No.: US 10,622,553 B2
(45) Date of Patent: Apr. 14, 2020

(54) CRYOGENIC PATTERNING OF MAGNETIC TUNNEL JUNCTIONS

(71) Applicant: International Business Machines Corporation, Armonk, NY (US)

(72) Inventors: Anthony J. Annunziata, Stamford, CT (US); Chandrasekharan Kothandaraman, New York, NY (US); Nathan P. Marchack, White Plains, NY (US); Hiroyuki Miyazoe, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/230,420

(22) Filed: Dec. 21, 2018

(65) Prior Publication Data
US 2019/0115528 A1  Apr. 18, 2019

Related U.S. Application Data

(62) Division of application No. 15/258,265, filed on Sep. 7, 2016, now Pat. No. 10,170,697.

(51) Int. Cl.
| | |
|---|---|
| *H01L 43/12* | (2006.01) |
| *H01L 43/08* | (2006.01) |
| *H01F 10/32* | (2006.01) |
| *H01F 41/30* | (2006.01) |
| *H01F 10/13* | (2006.01) |

(52) U.S. Cl.
CPC ........... *H01L 43/12* (2013.01); *H01F 10/132* (2013.01); *H01F 10/3254* (2013.01); *H01F 41/308* (2013.01); *H01L 43/08* (2013.01)

(58) Field of Classification Search
CPC ....................................................... H01L 43/12
See application file for complete search history.

(56) References Cited

U.S. PATENT DOCUMENTS

| | | | |
|---|---|---|---|
| 6,574,079 B2 * | 6/2003 | Sun ........................ | B82Y 10/00 257/E43.004 |
| 2005/0226043 A1 | 10/2005 | Parkin et al. | |
| 2013/0037894 A1 * | 2/2013 | Chung ..................... | H01L 43/12 257/421 |
| 2014/0248718 A1 | 9/2014 | Kim et al. | |
| 2017/0133233 A1 * | 5/2017 | Sato ..................... | H01L 21/3065 |

OTHER PUBLICATIONS

Anthony J. Annunziata et al., "Cryogenic Patterning of Magnetic Tunnel Junctions", U.S. Appl. No. 15/258,265, filed Sep. 7, 2016.
List of IBM Patents or Patent Applications Treated as Related; (Appendix P), Date Filed Dec. 26, 2018; 2 pages.

* cited by examiner

*Primary Examiner* — Marc Anthony Armand
(74) *Attorney, Agent, or Firm* — Cantor Colburn LLP; Vazken Alexanian

(57) ABSTRACT

Methods for forming magnetic tunnel junctions and structures thereof include cryogenic etching the layers defining the magnetic tunnel junction without lateral diffusion of reactive species.

10 Claims, 8 Drawing Sheets

CRYOGENIC PATTERNING OF MAGNETIC TUNNEL JUNCTIONS

DOMESTIC PRIORITY

This application is a DIVISIONAL of U.S. application Ser. No. 15/258,265, filed Sep. 7, 2016, the contents of which are incorporated by reference herein in its entirety.

The present invention generally relates to integrated circuits and methods for fabricating integrated circuits, and more particularly, the invention relates to integrated circuits and methods for fabricating integrated circuits having magnetic tunnel junctions (MTJs).

The dimensions of semiconductor devices and memory devices have been steadily shrinking as scaling to smaller dimensions leads to continuing device performance improvements. Memory devices, such as magnetoresistive random access memory devices, i.e., MRAM, have typically been formed using etch patterning methods, such as reactive ion etching. At the currently desired length scales, the lateral diffusion of oxidizing species present in prior etch patterning methods, such as reactive ion etching, can limit their suitability for forming memory devices.

SUMMARY

According to one or more embodiments of the present invention, a method for fabricating a magnetic tunnel junction includes sequentially depositing a first magnetic layer, an insulating layer, and a second magnetic layer onto a substrate, the substrate having a first electrode. The method includes anistropically etching the first magnetic layer, the insulating layer, and the second magnetic layer to form the magnetic tunnel junction on at least a portion of the first electrode, wherein anisotropically etching includes cooling the substrate to a temperature between 0° C. and −200° C. and exposing the first magnetic layer, the insulating layer, and the second magnetic layer to reactive plasma.

In one or more other embodiments, a method for fabricating a magnetic tunnel junction includes sequentially depositing a first magnetic layer, an insulating layer, and a second magnetic layer onto a substrate, the substrate including a first electrode. A sacrificial layer is then deposited onto the second magnetic layer. An opening is formed in the sacrificial layer and a liner layer is then conformally deposited onto the substrate. A portion of the liner layer on a top surface of the sacrificial layer is removed and; a conductive material is then deposited into the opening. Remaining portions of the liner layer and the sacrificial layer are selectively removed from the substrate and the first magnetic layer, the insulating layer, and the second magnetic layer are anistropically etched using the conductive material as a hard mask to form the magnetic tunnel junction on at least a portion of the first electrode, wherein anisotropically etching comprises cooling the substrate to a temperature between 0° C. and −200° C. and exposing the first magnetic layer, the insulating layer, and the second magnetic layer to reactive plasma.

In one or more embodiments, a semiconductor device includes a substrate including a bottom electrode; a magnetic tunnel junction disposed in an interlayer dielectric and on at least a portion of the bottom electrode, the magnetic tunnel junction comprising a first magnetic layer, an insulating layer on the first magnetic layer, and a second magnetic layer on the insulating layer. The device further includes s conductive mask including a bottom surface, a top surface and sidewalls extending from the bottom surface to the top surface, wherein the bottom surface is on the second magnetic layer of the magnetic tunnel junction. An upper electrode contacts an entirety of the sidewalls and the top surface of the conductive mask.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

Figure 8:
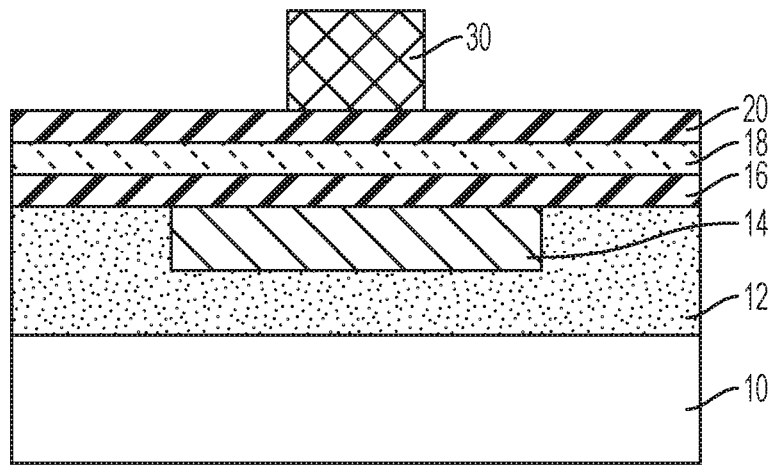
FIG. 8 is a cross-sectional view of the structure depicted in FIG. 7 after removal of the sacrificial layer and the remaining portion of the liner layer.
Figure 9:
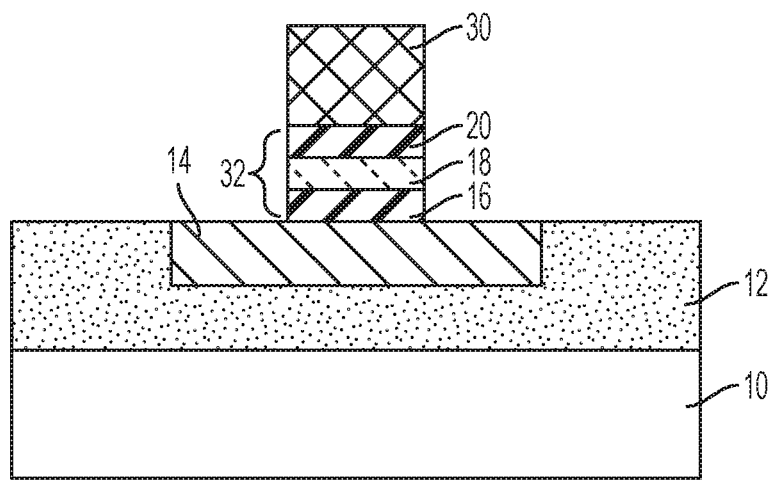
Figure 10:
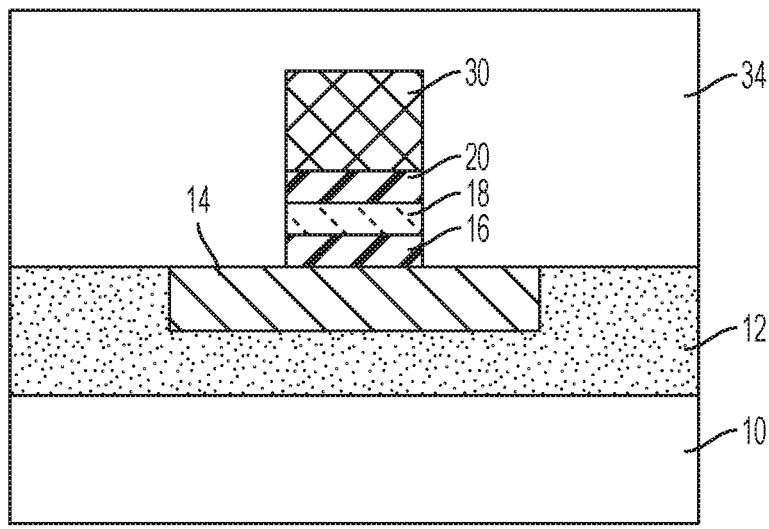
Figure 11:
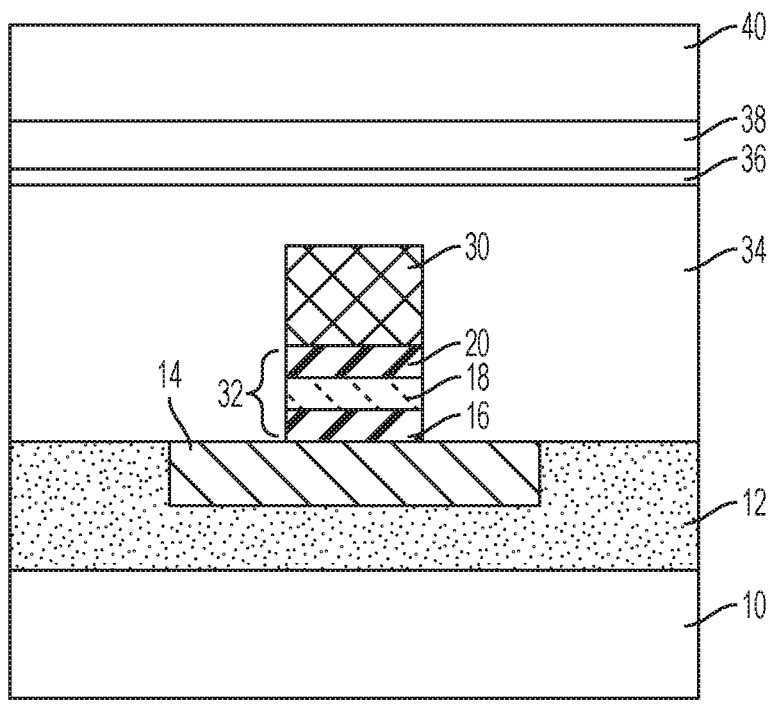
Figure 12:
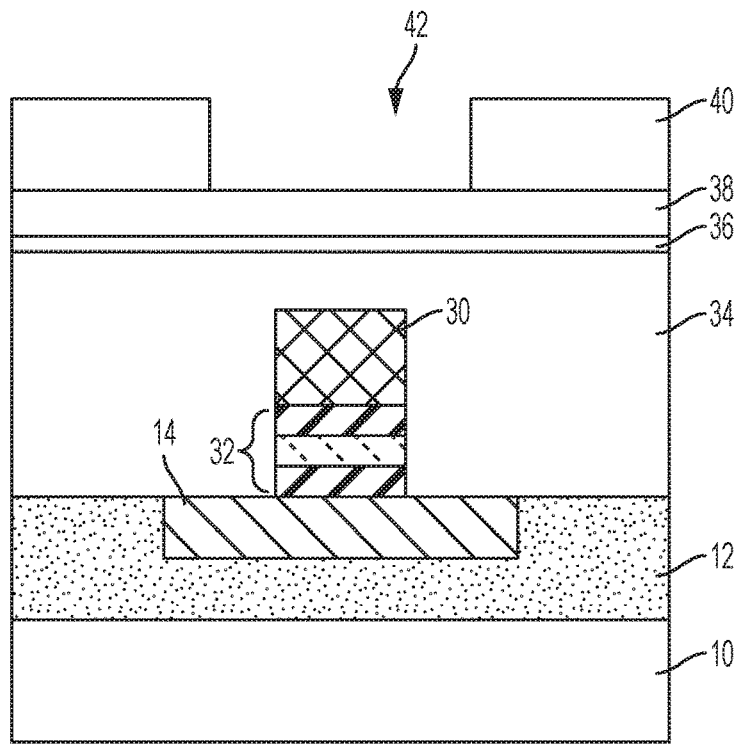
Figure 13:
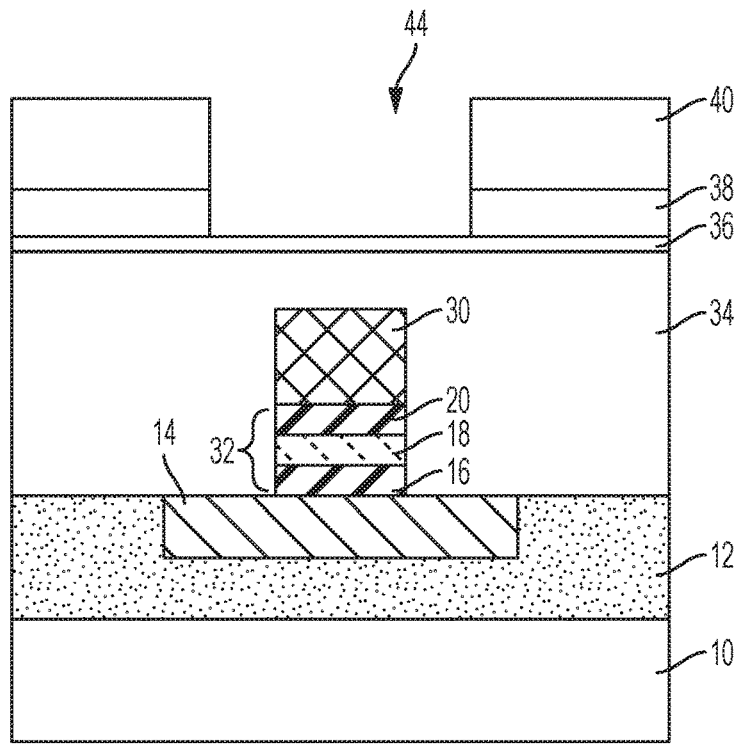
Figure 14:
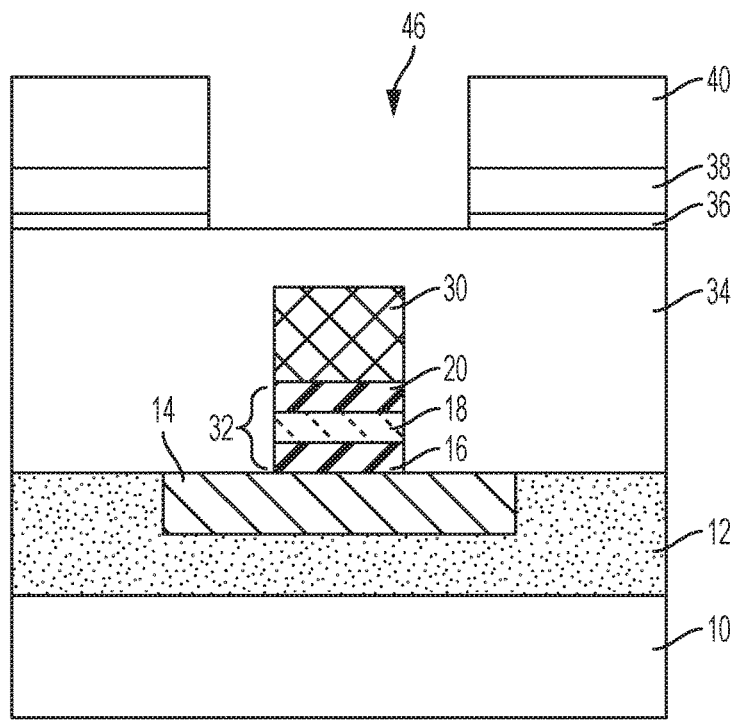
Figure 15:
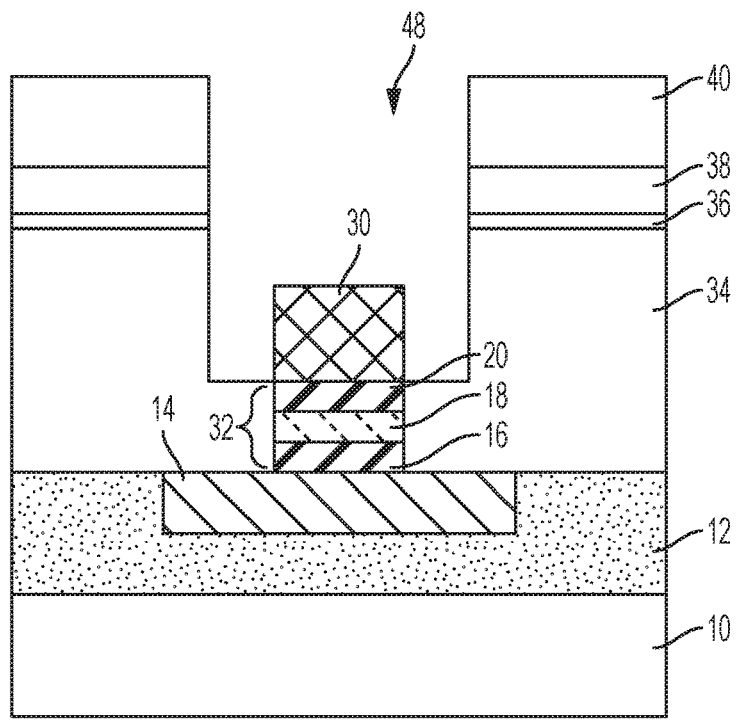
Figure 16:
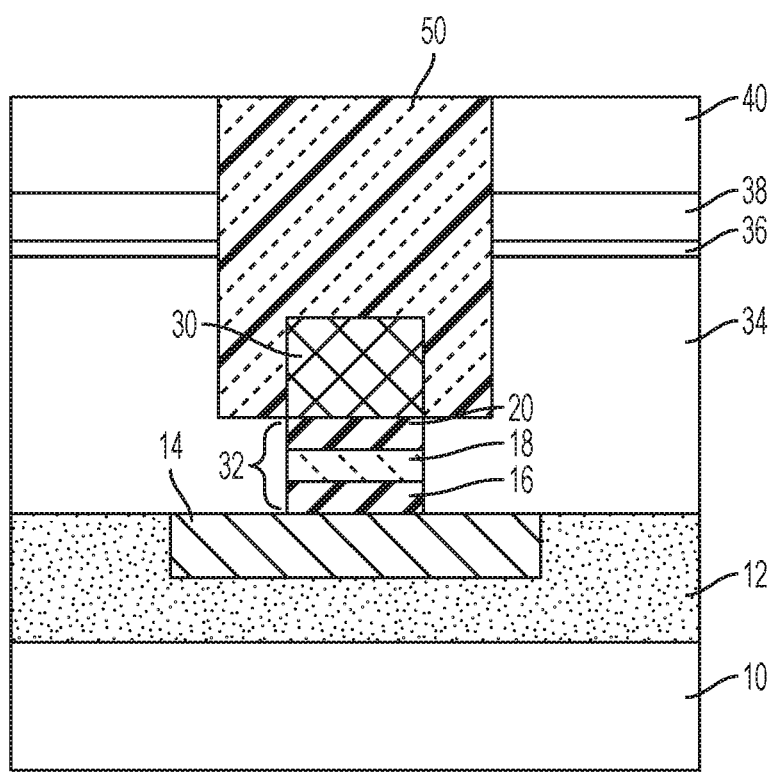

FIG, 9 is a cross-sectional view of the structure depicted in FIG. 8 after cryogenic etching of the first magnetic layer, the insulating layer, and the second magnetic layer to define a magnetic tunnel junction;

FIG. 10 is a cross-sectional view of the structure depicted in FIG. 9 after deposition of an interlayer dielectric;

FIG. 11 is a cross-sectional view of the structure depicted in FIG. 10 after sequential deposition of an oxide layer, an anti-reflective coating and a photoresist layer on the interlayer dielectric;

FIG. 12 is a cross-sectional view of the structure depicted in FIG. 11 after patterning of the photoresist to form an opening therein;

FIG. 13 is a cross-sectional view of the structure depicted in FIG. 12 after removal of the anti-reflective coating exposed by the opening in the photoresist;

FIG. 14 is a cross-sectional view of the structure depicted in FIG. 13 after removal of an exposed portion of the oxide layer after removal of the anti-reflective coating;

FIG. 15 is a cross-sectional view of the structure depicted in FIG. 14 after removal of a portion of the interlayer dielectric exposing the upper electrode stopping at the second magnetic layer; and FIG. 16 is a cross-sectional view of the structure depicted in FIG. 15 after deposition of a conductive material in the opening to electrically contact the upper electrode.

DETAILED DESCRIPTION

With reference now to FIGS. 1-16, sectional views of an exemplary magnetic tunnel junction illustrate a method and structure for fabricating the magnetic tunnel junction in accordance with one or more embodiments of the present invention. As will be discussed herein, the methods and resulting structures utilize an etching process at cryogenic temperatures for patterning the layers defining the magnetic tunnel junction to overcome the problems associated with prior art etching patterning methods, which were done at temperatures of about 20° C. or greater. For example, prior art etching processes such as reactive ion etching at temperatures of about 20° C. or greater have been found to create edge damage as a result of the lateral diffusion of reactive species such as oxygen. The edge damage can be as much as 7 nanometers on each side of the magnetic tunnel junction, thereby limiting the achievable pitch. Moreover, re-deposition of etched magnetic material on the sidewalls can make the device inoperable by forming an electrical short across the insulating layer of the magnetic tunnel junction. While ion beam etching can be used to remove the edge damage, it generates additional process steps. Moreover, as devices continue to scale to smaller dimensions the achievable pitch using prior art etching processes at temperatures at 20° C. or greater becomes limited because of the lateral damage to the magnetic junction tunnel structure.

By etching the magnetic tunnel junction at cryogenic temperatures, the nature of the etch process has been found to change. Although overall etch rate is lowered, which is expected, there is advantageously significantly less edge damage as etching at cryogenic temperatures to form the magnetic tunnel junctions has been found to markedly reduce the lateral etch rate, which is mainly a chemical reaction, compared to the vertical etch rate, which is mainly accelerated by ion energy. Additionally, the use of cryogenic temperatures reduces lateral diffusion of reactive species such as oxygen or similar atoms/molecules. As a result, it has been found that sidewall edge roughness is decreased during the cryogenic etching process, thereby eliminating the need for edge damage repair and providing a process to maximize pitch, which is desirable for reasons discussed above as devices continue to scale to smaller dimensions.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, an article or apparatus that comprises a list of elements is not necessarily limited to only those elements but can include other elements not expressly listed or inherent to such article or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the illustrated structures, as they are oriented in the drawing figures. The same numbers in the various figures can refer to the same structural component or part thereof.

Figure 1:
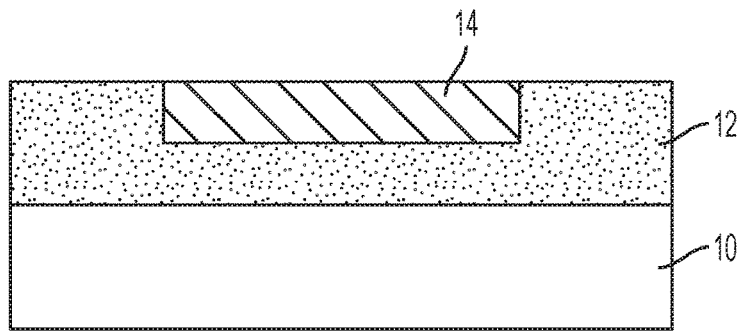
FIG. 1 is a cross-sectional view depicting a structure including a bottom electrode formed on a substrate, in accordance with one or more embodiments of the present invention.

Turning now to FIG. 1, there is shown a base contact 14 (hereafter referred to as first electrode) that is positioned on a substrate 10, which typically contains other structures and devices such as transistors and diodes. In FIG. 1, the first electrode 14 is present in a trench that is typically formed in a layer 12 on the substrate 10. In some embodiments, the layer 12 can be composed of a dielectric material, such as an oxide, nitride or oxynitride material. Exemplary dielectric materials suitable in the formation of layer 12 include, without limitation, silicon oxide ($SiO_2$); borosilicate glass (BSG); borophosphosilicate glass (BPSG); phosphorsilicate glass (PSG), tetraethylorthosilicate (TEOS), a high density plasma (HDP) oxide, and a spin on glass (SOG), silicon nitride, various other silicon materials including SiC, SiCO, SiCOH, and SiCH compounds, wherein the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α—C:H). In some embodiments, a semiconductor material can be used for the layer 12 instead of a dielectric material, or the substrate can include a combination of semiconductor and dielectric materials.

In some embodiments, the trench that is present in layer 12 that houses the first electrode 14 can be formed by lithographically pattern the layer followed by etch processing. For example, the trench can be formed in the layer 12 by forming a photoresist mask on the upper surface of the layer 12. Thereafter, an etch process, such as reactive ion etch (RIE), can be applied to etch the exposed portions of the layer 12 that are not protected by the photoresist mask. The etch process can be an etch process that removes the material of the layer 12 selectively to the photoresist mask. The term "selective" as used to describe a material removal process denotes that the rate of material removal for a first material is greater than the rate of removal for at least another material of the structure to which the material removal process is being applied. For example, in one or more embodiments, a selective etch can include an etch chemistry that removes a first material selectively to a second material by a ratio of 10:1 or greater.

Still referring to FIG. 1, the first electrode 14 can be formed in the trench that is formed in layer 12. The first electrode 14 can be composed of any electrically conductive material. An "electrode" as used to describe a component of the memory devices represents one of the two electrically conductive materials of the memory device that are on opposing sides and separated by the magnetic tunnel junction (MTJ). "Electrically conductive" as used through the present description means a material typically having a room temperature conductivity of greater than $10^{-8}(\Omega\text{-m})^{-1}$. In some embodiments, the first electrode 14 is composed of a metal material, such as copper, aluminum, tantalum, tungsten, titanium, platinum, silver, nickel or gold. In the embodiments, in which the first electrode 14 is composed of a metal, the first electrode 14 can be deposited using a physical vapor deposition (PVD) process. Examples of physical vapor deposition (PVD) processes that are suitable for forming the first electrode 14 include plating, sputtering, electroplating, electrophoretic deposition, and combinations thereof. In other embodiments, the metal can be deposited using a chemical vapor deposition process, such as plasma enhanced chemical vapor deposition (PECVD). In some embodiments, the material of the first electrode 14 can be an electrically conductive semiconductor, such as n-type doped polysilicon.

Typically, one side of the first electrode 14 comes in contact with a junction region of a transistor (not shown) in the substrate 10, and the other side of the first electrode 14 comes in contact with the magnetic tunnel junction as fabricated herein. In this case, the first electrode 14 can be completely overlapped with the magnetic tunnel junction or partially overlapped with the magnetic tunnel junction.

Following deposition of the material for the first electrode 14 in the trench of the layer 12, a planarization process, such as chemical mechanical planarization (CMP) can be used to planarize the upper surface of the electrically conductive material that is present in the trench. In some embodiments, the planarization process can continue until the upper surface of the electrically conductive material that provides the first electrode 14 within the trench is coplanar with the upper surface of the portion of the layer 12 that is not etched. Optionally, a capping layer (not shown) can be disposed on the exposed surface of the first electrode 14. Typically, the capping layer is tantalum or a nitride thereof.

Figure 2:
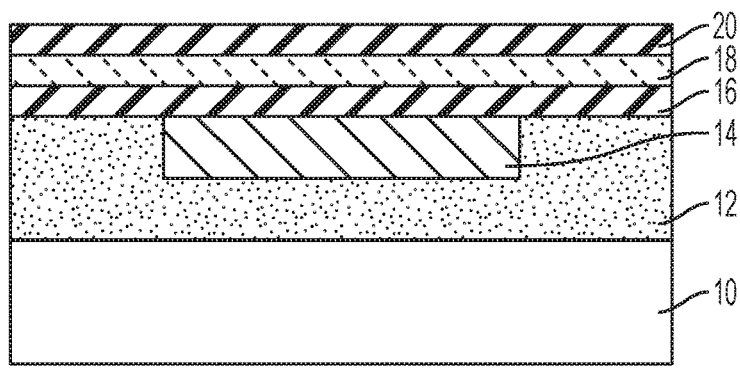
FIG. 2 is a cross-sectional view of the structure depicted in FIG. 1 after sequential deposition of a first magnetic layer, an insulator layer, and a second magnetic layer.

As illustrated in FIG. 2, a first magnetic layer 16, an insulating layer 18, and a second magnetic layer 20 are sequentially formed on layer 12 having the first electrode 14 formed thereon. Layers 16, 18, and 20 will subsequently be patterned and will define the magnetic tunnel junction 32 (see FIG. 9). The magnetic layers can be deposited through vacuum deposition technologies (i.e., sputtering) or electrodeposition through an aqueous solution. Vacuum methods have the ability to deposit a large variety of magnetic materials and to easily produce laminated structures. However, they usually have low deposition rates, poor conformal coverage, and the derived magnetic films are difficult to pattern. Electroplating has been a standard technique for the deposition of thick metal films due to its high deposition rate, conformal coverage and low cost. The insulating layer can be deposited using a deposition process, including, but not limited to, PVD, CVD, PECVD, or any combination thereof.

The first magnetic layer 16 that is present on the first electrode 14 is not intended to be limited to any specific material and can include NiFe, IrMn, PtMn, Ru, Ta, TaN, CrMo, CoFe, CoFeB, CoZrTi, CoZrTa, CoZr, CoZrNb, CoZrMo, CoTi, CoNb, CoHf, CoW, FeCoN, FeCoAlN, CoP, FeCoP, CoPW, CoBW, CoPBW, FeTaN, FeCoBSi, FeNi, CoFeHfO, CoFeSiO, CoZrO, CoFeAlO, combinations thereof, or the like. The first magnetic layer 16 can be composed of a single layer or multiple layers. It is noted that the above noted materials for the first magnetic plate 16 are selected for illustrative purposes only and are not intended to be limiting. The thickness for the first magnetic layer 16 can range from 5 nm to 20 nm. In one or more other embodiments, the thickness of the first magnetic layer 16 can range from 5 nm to 10 nm.

In one or more embodiments, a lower electrode (not shown) can be further interposed between the first electrode 14 and the first magnetic layer 16.

The insulating layer 18 that is present between the first magnetic layer 16 and the second magnetic layer 20 can be referred to as a barrier layer and generally functions as tunnel insulating layer. The bulk resistivity and the eddy current loss of the magnetic structure can be controlled by the insulating layer. The insulating layer 18 for the magnetic tunnel junction can be composed of a dielectric material that is selected from the group consisting of aluminum oxide ($Al_2O_3$), magnesium oxide (MgO), boron nitride (BN), silicon oxynitride ($SiO_xN_y$), silicon oxide ($SiO_2$), and combinations thereof. The thickness of the insulating layer 18 can range from 1 nm to 20 nm. In another embodiment, the thickness of the insulating layer 18 can range from 1 nm to 10 nm. The bulk resistivity and the eddy current loss of the magnetic structure can be controlled by the insulating layer. The insulating layer can be deposited using a deposition process, including, but not limited to, PVD, CVD, PECVD, or any combination thereof.

The second magnetic layer 20 that is present on the surface of the insulating layer 18 can be referred to as the reference layer of the magnetic tunnel junction. The second magnetic layer 20 can be NiFe, IrMn, PtMn, Ru, Ta, TaN, CrMo, CoFe, CoFeB, CoZrTi, CoZrTa, CoZr, CoZrNb, CoZrMo, CoTi, CoNb, CoHf, CoW, FeCoN, FeCoAlN, CoP, FeCoP, CoPW, CoBW, CoPBW, FeTaN, FeCoBSi, FeNi, CoFeHfO, CoFeSiO, CoZrO, CoFeAlO, combinations thereof, or the like. The second magnetic layer 20 can be composed of a single layer or multiple layers. It is noted that the above noted materials for the second magnetic layer 20 are selected for illustrative purposes only and are not intended to be limiting. The thickness for the second magnetic layer 20 can range from 5 nm to 20 nm. In one or more other embodiments, the thickness of the second magnetic plate 28 can range from 5 nm to 10 nm.

Figure 3:
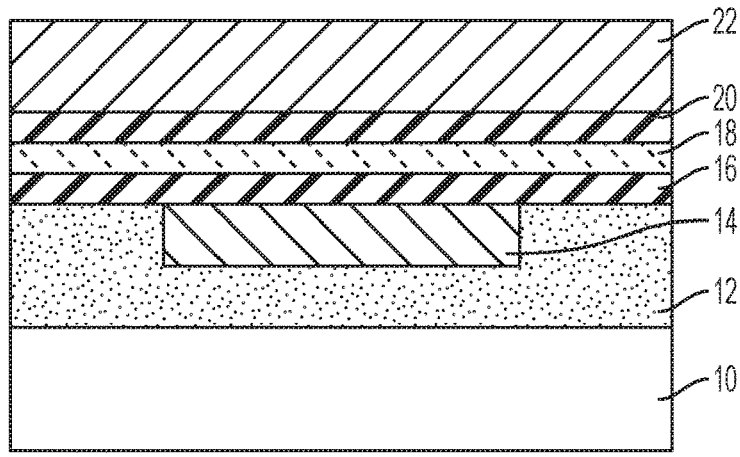
FIG. 3 is a cross-sectional view of the structure depicted in FIG. 2 after deposition of a sacrificial layer onto the second magnetic layer.

Referring now to FIG. 3, a sacrificial layer 22 is formed on the second magnetic layer 20. The sacrificial layer 22 can be at least one of oxide-based material layers, e.g., a BSG layer, a BPSG layer, a PSG layer, a TEOS layer, an HDP oxide layer, and an SOG layer.

Figure 4:
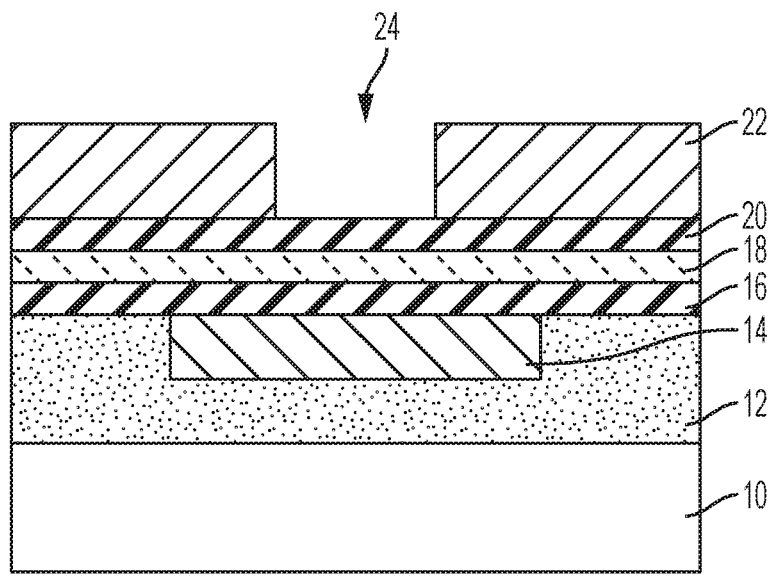
FIG. 4 is a cross-sectional view of the structure depicted in FIG. 3 after formation of a first opening in the sacrificial layer to the second magnetic layer.

In FIG. 4, an opening 24 is formed in the sacrificial layer 22 by selectively etching the sacrificial layer 22. The selective etching of the sacrificial layer 22 generally includes a lithographic process of forming a mask pattern with a photoresist having an opening for the area of the sacrificial layer 22 in which the opening 24 is to be formed and then etching the sacrificial layer 22 using the mask pattern as an etching barrier (mask).

Figure 5:
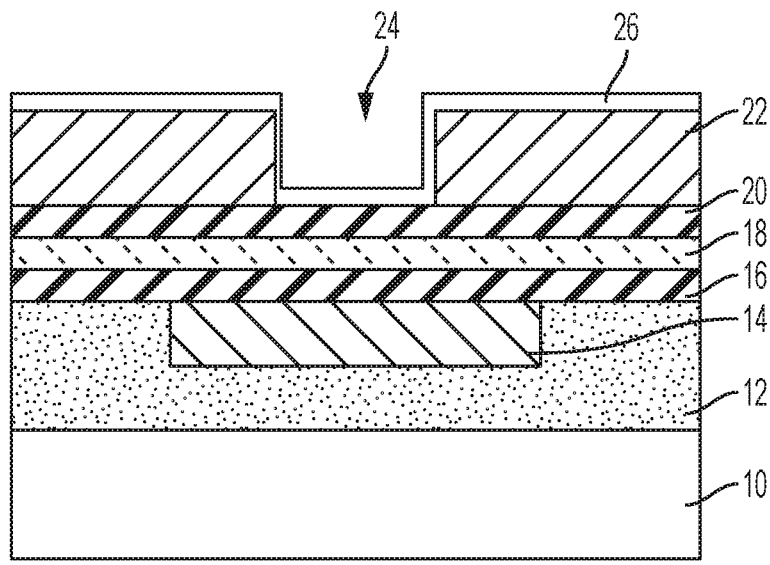
FIG. 5 is a cross-sectional view of the structure depicted in FIG. 4 after conformally depositing a liner layer onto the sacrificial layer.

As illustrated in FIG. 5, an insulating layer 26 is conformally deposited on the substrate 10. The insulating layer 26 is a thin film having high etch selectivity to the sacrificial layer 22, and it can be, for example, a nitride layer.

Figure 6:
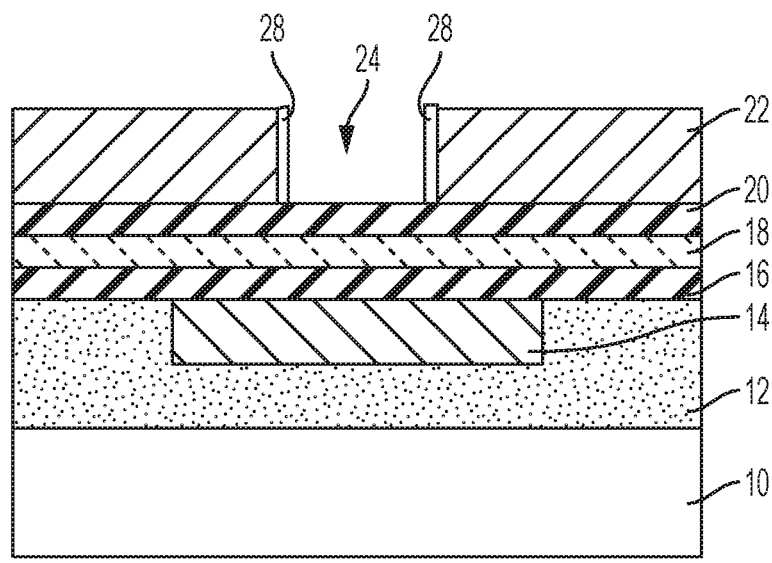
FIG. 6 is a cross-sectional view of the structure depicted in FIG. 5 after removal of a portion of the liner layer deposited on a top surface of the sacrificial layer.

As illustrated in FIG. 6, the substrate 10 is then selectively etched to remove the insulating layer 26 from the top surfaces of the sacrificial layer 22 so as to provide a spacer pattern 28 of the insulating material on a sidewall of the opening 24. The etching of the insulating layer 26 can be performed through a blanket etch or etch back process. The thickness of the spacer pattern 28 functions to adjust the sectional area defined by the opening 24.

Figure 7:
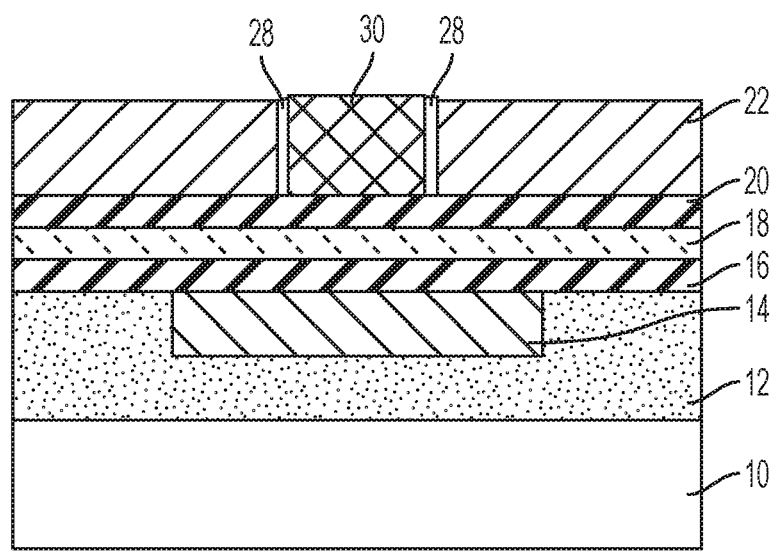
FIG. 7 is a cross-sectional view of the structure depicted in FIG. 6 after deposition of a conductive metal in the first opening to form an upper electrode.

As illustrated in FIG. 7, a conductive material 30 is deposited into the opening 24. The opening 24 is completely filled with the conductive material, after which any excess conductive material is planarized to the level of layer 22. The planarization can be performed through a chemical mechanical polishing (CMP) process. The conductive material 30 can function as an electrode for supplying current to the underlying magnetic tunnel junction and as a mask pattern for patterning the magnetic tunnel junction. An exemplary process of forming the sacrificial layer 22, the opening 24, and the conductive material 30 is a damascene process.

The conductive material 30 that is present on the second magnetic layer 20 can be composed of any electrically conductive material. Typically, the conductive material is selected so that it can function as an etch mask for subsequent patterning of the magnetic tunnel junction material layers 16, 18, and 20 to form the magnetic tunnel junction 32 (see FIG. 9), while being electrically conductive so that the structure can remain following patterning of the magnetic tunnel junction so that the upper electrode provides an electrical contact to the magnetic tunnel junction.

In one or more embodiments, the conductive material 30 can be composed of a transition metal. For example, the electrically conductive mask 30 can be composed of copper (Cu), titanium (Ti), titanium nitride (TiN), tantalum (Ta), tantalum nitride (TaN), aluminum (Al), tungsten (W) and combinations thereof. In some embodiments, the conductive material 30 can also be composed of a semiconductor material, such as doped polysilicon. In one or more embodiments, the electrically conductive material 30 can have a thickness ranging from 20 nm to 100 nm. In one or more other embodiments, the conductive material 30 can range from 40 nm to 60 nm.

As illustrated in FIG. 8, the remaining sacrificial layer 22 and the spacer 28 are then selectively removed by an etching process leaving the upper electrode 30 on the second magnetic layer 20. A cleansing process can then be performed so as to remove any etch residues generated in the process of removing the sacrificial layer 22 and the spacer pattern 28.

Turning now to FIG. 9, the substrate 10 is then subjected to a cryogenic directional plasma etching process using the upper electrode 30 as a hard mask stopping at layer 12 so as to pattern layers 16, 18, and 20 and form the magnetic tunnel junction 32. During the plasma etching process, the substrate during plasma etching is cooled to a temperature of less 0° C. to −200° C. In one or more other embodiments, the substrate is cooled during etching to less than 0° C. to −100° C., and in still one or more other embodiments, the substrate is cooled during etching to about −40° C. For example, the substrate can be cooled by contacting at least a portion of the chuck supporting the substrate to liquid nitrogen. A suitable plasma etching apparatus configured with cooling means is described in U.S. Pat. No. 6,174,408, which is incorporated by reference in its entirety.

A suitable plasma etching process is a reactive ion etching process, which uses chemically reactive plasma to anisotropically remove the exposed portions of layers 16, 18, and 20. In the RIE process, plasma is initiated in the system by applying a strong RF (radio frequency) electromagnetic field to the wafer platter. The field is typically set to a frequency of 13.56 Megahertz, applied at a few hundred watts. The oscillating electric field ionizes the gas molecules by stripping them of electrons, creating a plasma.

In each cycle of the field, the electrons are electrically accelerated up and down in the chamber, sometimes striking both the upper wall of the chamber and the wafer platter. At the same time, the much more massive ions move relatively little in response to the RF electric field. When electrons are absorbed into the chamber walls they are simply fed out to ground and do not alter the electronic state of the system. However, electrons deposited on the wafer platter cause the platter to build up charge due to its DC isolation. This charge build up develops a large negative voltage on the platter, typically around a few hundred volts. The plasma itself develops a slightly positive charge due to the higher concentration of positive ions compared to free electrons.

Due to the mostly vertical delivery of reactive ions, reactive-ion etching can produce very anisotropic etch profiles, which contrast with the typically isotropic profiles of wet chemical etching. In general, the etch chemistry is selective to removal of the different layers defining the magnetic tunnel junction. Exemplary etch chemistries include, but are not limited to, $CH_3OH$, an admixture of $NH_3/CO$, Ar, or any combination of the aforementioned.

FIGS. 10-16 illustrate the post cryogenic etch process steps to form the magnetic tunnel junction structure. In FIG. 10, an interlayer dielectric (ILD) 34 is deposited onto the substrate 10. The ILD can include any dielectric material including inorganic dielectrics or organic dielectrics. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The ILD can be deposited by spin on processes, PECVD processes or the like as is generally known in the art.

In FIG. 11, an oxide layer 36, an anti-reflective coating layer 38 and a photoresist layer 40 can be sequentially deposited. Utilizing lithographic processes, the photoresist layer 40 is first patterned to provide an opening 42 therein as shown in FIG. 12. A portion of the anti-reflective coating layer 38 exposed by the opening 42 is then removed to form opening 44 as shown in FIG. 13. A portion of the oxide layer 36 exposed by opening 44 is then removed to form opening 46 as shown in FIG. 14. In FIG. 15, the interlayer dielectric 34 is etched to expose the upper electrode 30. In FIG. 16, the opening is then filled with a conductive material 50 so as to electrically connect to the upper electrode 30.

While the methods and structures of the present description have been particularly shown and described with respect to preferred embodiments thereof, it will be understood by those skilled in the art that the foregoing and other changes in forms and details can be made without departing from the spirit and scope of the present description. It is therefore intended that the present invention not be limited to the exact forms and details described and illustrated, but fall within the scope of the appended claims.

What is claimed is:
1. A semiconductor device, comprising:
a substrate including a bottom electrode;
a magnetic tunnel junction disposed in an interlayer dielectric and on at least a portion of the bottom electrode, the magnetic tunnel junction comprising a first magnetic layer, an insulating layer on the first magnetic layer, and a second magnetic layer on the insulating layer;
a conductive mask including a bottom surface, a top surface and sidewalls extending from the bottom surface to the top surface, wherein the bottom surface is on the second magnetic layer of the magnetic tunnel junction; and
an upper electrode contacting an entirety of the sidewalls and the top surface of the conductive mask.

2. The semiconductor device of claim 1, wherein the first and second magnetic layers are formed of a material comprising NiFe, IrMn, PtMn, Ru, Ta, TaN, CrMo, CoFe, CoFeB, CoZrTi, CoZrTa, CoZr, CoZrNb, CoZrMo, CoTi, CoNb, CoHf, CoW, FeCoN, FeCoAlN, CoP, FeCoP, CoPW, CoBW, CoPBW, FeTaN, FeCoBSi, FeNi, CoFeHfO, CoFeSiO, CoZrO, CoFeAlO, or combinations including at least one of the foregoing.

3. The semiconductor device of claim 1, wherein the insulating layer comprises aluminum oxide, magnesium oxide, boron nitride, silicon oxynitride, silicon oxide, and combinations thereof.

4. The semiconductor device of claim 1, wherein the conductive mask comprises copper, titanium, titanium nitride,tantalum, tantalum nitride, aluminum, tungsten, or combinations including at least one of the foregoing.

5. The semiconductor device of claim 1, wherein the bottom electrode and the conductive mask comprise tantalum nitride.

6. The semiconductor device of claim 1, wherein the conductive mask has a width equal to a width of the magnetic tunnel junction.

7. The semiconductor device of claim 1, wherein the bottom electrode has a width greater than the first magnetic layer, the insulating layer, and the second magnetic layer.

8. The semiconductor device of claim 1, wherein the conductive mask comprises a transition metal.

9. The semiconductor device of claim 1, wherein the conductive mask has a thickness ranging from 20 nanometers to 100 nanometers.

10. The semiconductor device of claim 1, wherein the conductive mask comprises a semiconductor material.

* * * * *